(12) United States Patent
Gaan et al.

(10) Patent No.: US 9,466,701 B2
(45) Date of Patent: Oct. 11, 2016

(54) PROCESSES FOR PREPARING INTEGRATED CIRCUITS WITH IMPROVED SOURCE/DRAIN CONTACT STRUCTURES AND INTEGRATED CIRCUITS PREPARED ACCORDING TO SUCH PROCESSES

(71) Applicant: GLOBALFOUNDRIES, Inc., Grand Cayman (KY)

(72) Inventors: Sandeep Gaan, Clifton Park, NY (US); Sipeng Gu, Clifton Park, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/244,261

(22) Filed: Apr. 3, 2014

(65) Prior Publication Data

US 2015/0287795 A1  Oct. 8, 2015

(51) Int. Cl.
| | |
|---|---|
| *H01L 21/31* | (2006.01) |
| *H01L 29/66* | (2006.01) |
| *H01L 21/306* | (2006.01) |
| *H01L 21/311* | (2006.01) |
| *H01L 29/78* | (2006.01) |
| *H01L 29/417* | (2006.01) |
| *H01L 21/8234* | (2006.01) |
| *H01L 21/768* | (2006.01) |

(52) U.S. Cl.
CPC ... *H01L 29/66795* (2013.01); *H01L 21/30604* (2013.01); *H01L 21/31111* (2013.01); *H01L 21/31116* (2013.01); *H01L 21/31144* (2013.01); *H01L 21/76897* (2013.01); *H01L 21/823418* (2013.01); *H01L 21/823431* (2013.01); *H01L 21/823475* (2013.01); *H01L 29/41791* (2013.01); *H01L 29/785* (2013.01)

(58) Field of Classification Search
CPC ............... H01L 21/76802; H01L 21/76804
See application file for complete search history.

(56) References Cited

U.S. PATENT DOCUMENTS

| | | | |
|---|---|---|---|
| 6,440,875 B1* | 8/2002 | Chan | H01L 21/31116 257/E21.252 |
| 8,704,281 B2* | 4/2014 | Maehara | B82Y 10/00 257/291 |
| 9,000,505 B2* | 4/2015 | Edwards | H01L 21/26586 257/300 |
| 9,048,289 B2* | 6/2015 | Harper | |
| 9,070,640 B2* | 6/2015 | Gwak | |
| 9,196,613 B2* | 11/2015 | Basker | H01L 27/0924 |

* cited by examiner

*Primary Examiner* — Zandra Smith
*Assistant Examiner* — Andre' C Stevenson
(74) *Attorney, Agent, or Firm* — Lorenz & Kopf, LLP

(57) ABSTRACT

Processes for preparing an integrated circuit for contact landing, processes for fabricating an integrated circuit, and integrated circuits prepared according to these processes are provided herein. An exemplary process for preparing an integrated circuit for contact landing includes providing a semiconductor structure that includes a transistor with source and drain regions, wherein at least one of the source and drain regions has a shaped contact structure overlaid with a contact etch stop layer and a pre-metal dielectric material. The pre-metal dielectric material is removed with one or more anisotropic etches, including at least one anisotropic etch selective to the pre-metal dielectric material. And, the contact etch stop layer overlaying the shaped contact structure is removed with a third anisotropic etch selective to the contact etch stop layer material to expose the shaped contact structure.

18 Claims, 10 Drawing Sheets

PROCESSES FOR PREPARING INTEGRATED CIRCUITS WITH IMPROVED SOURCE/DRAIN CONTACT STRUCTURES AND INTEGRATED CIRCUITS PREPARED ACCORDING TO SUCH PROCESSES

TECHNICAL FIELD

The technical field generally relates to processes for preparing integrated circuits for contact landing, processes for fabricating an integrated circuit, and integrated circuits prepared according to such processes, and more particularly relates to processes for preparing integrated circuit contact structures for contact landing and integrated circuits with such contact structures.

BACKGROUND

The majority of present day integrated circuits (ICs) are implemented by using a plurality of interconnected field effect transistors (FETs), also called metal oxide semiconductor field effect transistors (MOSFETs or MOS transistors). A MOS transistor includes a gate electrode as a control electrode overlying a semiconductor substrate and spaced-apart source and drain regions in the substrate between which a current can flow. A gate insulator is disposed between the gate electrode and the semiconductor substrate to electrically isolate the gate electrode from the substrate. A control voltage applied to the gate electrode controls the flow of current through a channel in the substrate underlying the gate electrode between the source and drain regions.

As advanced metal-oxide-semiconductor (MOS) technology continues to scale and move into the deep-sub-micron geometry dimensions, the optimization of source/drain regions has become complex. In particular, shaped contact structures in the source and drain regions may be utilized to improve available contact area. However, conventional techniques to clean and prepare the shaped contact structures during integrated circuit manufacture often result in damage to the shaped contact structures, resulting in suboptimal contact and increased contact resistance.

Accordingly, it is desirable to provide methods of forming semiconductor devices with increased surface contact and reduced damage to shaped contact structures in source and drain regions resulting from mask stripping and substrate cleaning. Furthermore, other desirable features and characteristics of the present invention will become apparent from the subsequent detailed description of the invention and the appended claims, taken in conjunction with the accompanying drawings and this background of the invention.

BRIEF SUMMARY

Processes for preparing integrated circuits for contact landing, processes for fabricating an integrated circuit, and integrated circuits prepared according to these processes are described herein. In one embodiment, a method for preparing an integrated circuit for contact landing includes providing a semiconductor structure that includes a transistor with source and drain regions, wherein at least one of the source and drain regions has a shaped contact structure overlaid with a contact etch stop layer and a pre-metal dielectric material. The process further includes removing a first portion of the pre-metal dielectric material with a first anisotropic etch such that a second portion of the pre-metal dielectric material remains overlaying the shaped contact structure. The second portion of the pre-metal dielectric material is removed with a second anisotropic etch, wherein the second anisotropic etch is capable of etching the pre-metal dielectric material while being substantially ineffective against the contact etch stop layer. And, the contact etch stop layer overlaying the shaped contact structure is removed with a third anisotropic etch to expose the shaped contact structure, wherein the third anisotropic etch is capable of etching the contact etch stop layer while being substantially ineffective against the shaped contact structure.

In another embodiment, a process for fabricating an integrated circuit includes providing a semiconductor substrate; forming a transistor with a gate electrode structure and source and drain regions in and on the semiconductor substrate, wherein at least one of the source and drain regions includes a shaped contact structure overlaid with a contact etch stop layer and a pre-metal dielectric material. The process further includes removing a first portion of the pre-metal dielectric material with a first anisotropic etch such that a second portion of the pre-metal dielectric material remains overlaying the shaped contact structure. The second portion of the pre-metal dielectric material is removed with a second anisotropic etch, wherein the second anisotropic etch is capable of etching the pre-metal dielectric material while being substantially ineffective against the contact etch stop layer. The contact etch stop layer overlaying the shaped contact structure is removed with a third anisotropic etch to expose the shaped contact structure, wherein the third anisotropic etch is capable of etching the contact etch stop layer while being substantially ineffective against the shaped contact structure And, an electrical contact material is applied to the exposed shaped contact structure.

In another embodiment, an integrated circuit including a shaped contact structure with an upper surface in contact with an electrical contact material is provided, wherein the shaped contact structure is an epitaxially deposited semiconductor material with a substantially regular cross-sectional shape that is substantially equivalent to a cross-sectional shape of the shaped contact structure formed at the time of epitaxial deposition, and wherein the interface between the shaped contact structure and electrical contact material is substantially free of contact etch stop layer material.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Processes for preparing integrated circuits with improved source/drain contact structures and integrated circuits prepared according to such processes are provided herein. In particular, integrated circuits formed in accordance with processes described herein include a semiconductor substrate with a transistor formed therein and thereon, with a gate electrode structure overlying the semiconductor substrate, source and drain regions formed within the semiconductor substrate and contact structures formed overlying the source and/or drain regions. The methods described herein allow for improved mask stripping and cleaning of these contact structures while also providing for preservation of contact structure shape. As a result, integrated circuits prepared according to processes provided herein have less contact resistance at the shaped contact structures after contact landing.

Conventional techniques employed to protect and prepare contacts at the source and drain regions are difficult to precisely control, resulting in increased contact resistance. In a conventional manufacturing process, the semiconductor substrate is etched in the source and/or drain region to form a series of thin walled structures (or fins). A non-conductive material (e.g., silicon oxide) is deposited between the fins to electrically isolate the fins from one another. Deposition of the non-conductive material is performed such that at least a surface at the top of each fin is uncovered, and typically such that a portion of each fin extends above the non-conductive material. Shaped contact structures are then deposited on an upper surface of each fin. The shaped contact structures typically comprise a semiconductor material, such as the same semiconductor material making up the semiconductor substrate. Further, deposition of the shaped contact structures typically occurs via epitaxial deposition, resulting in formation of regularly shaped contact structures due to crystal growth of the semiconductor material. Specifically, contact structures grown from epitaxial deposition of a semiconductor material typically have a cross-sectional shape approximating a diamond, and are referred herein as diamond-shaped contact structures.

Figure 1:
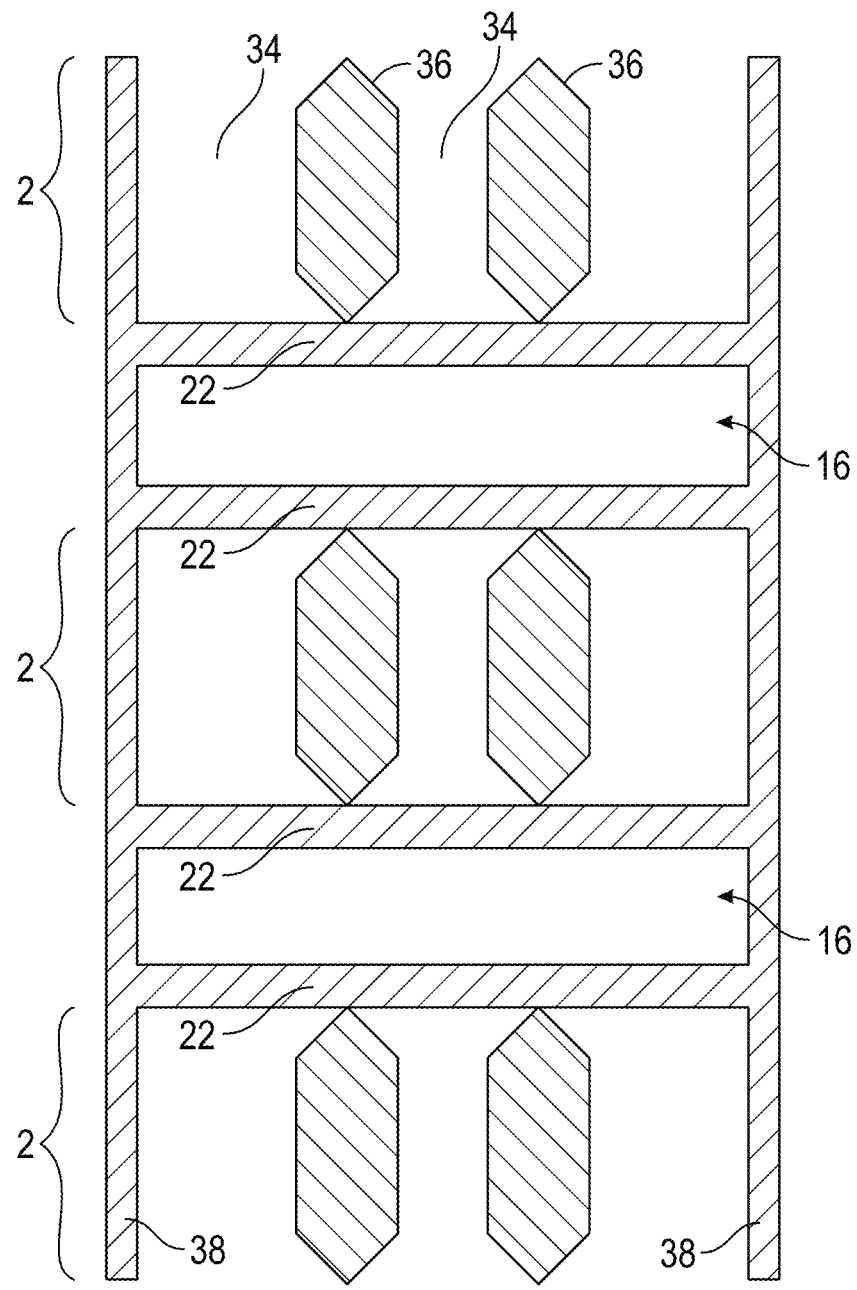
FIG. 1 illustrates an exemplary pre-fabricated semiconductor device showing the relative orientations of shaped contact structures located in source/drain regions, gate electrode structures, and spacer sidewalls.

An illustration from an overhead point of view of an exemplary device prepared to this point is seen in FIG. 1, where shaped contact structures 36 are shown located in source/drain regions 2 that are adjacent to gate electrode structures 16 and 17 defined by gate structure walls 22, each with a surface facing the shaped contact structures 36. The shaped contact structures 36 are located atop semiconductor fins 32 extending in an upward direction from semiconductor substrate 10 (neither of which are seen from the viewing angle of FIG. 1). The semiconductor fins 32, and thus an axis of the shaped contact structures 36, are typically substantially perpendicular to the gate structure walls 22. The semiconductor fins 32 are electrically isolated with non-conductive material 34. Further, groups of one or more semiconductor fins 32, and thus groups of one or more shaped contact structures 36, may be separated by spacer sidewalls 38 that run substantially parallel to the fins 32. In such embodiments, groups of one or more shaped contact structures 36 may be surrounded by an area defined by two gate structure walls 22 and two spacer sidewalls 38. For example, the device illustrated in FIG. 1 shows groups of two shaped contact structures 36 in such a configuration. In these embodiments, the group of shaped contact structures may be used to establish electrical contact between a contact material and a gate electrode structure 16 or 17.

Conventionally, to prepare for contact patterning, the shaped contact structures are overlaid with a contact etch stop layer (such as a 10-15 nm thick oxide or nitride layer) to protect the shaped contact structures during later contact etching. The area above the protected shaped contact structures is then filled with a pre-metal dielectric (PMD) material (such as an oxide-based material) in preparation for ion implantation and source/drain region formation, as discussed below.

Figure 2:
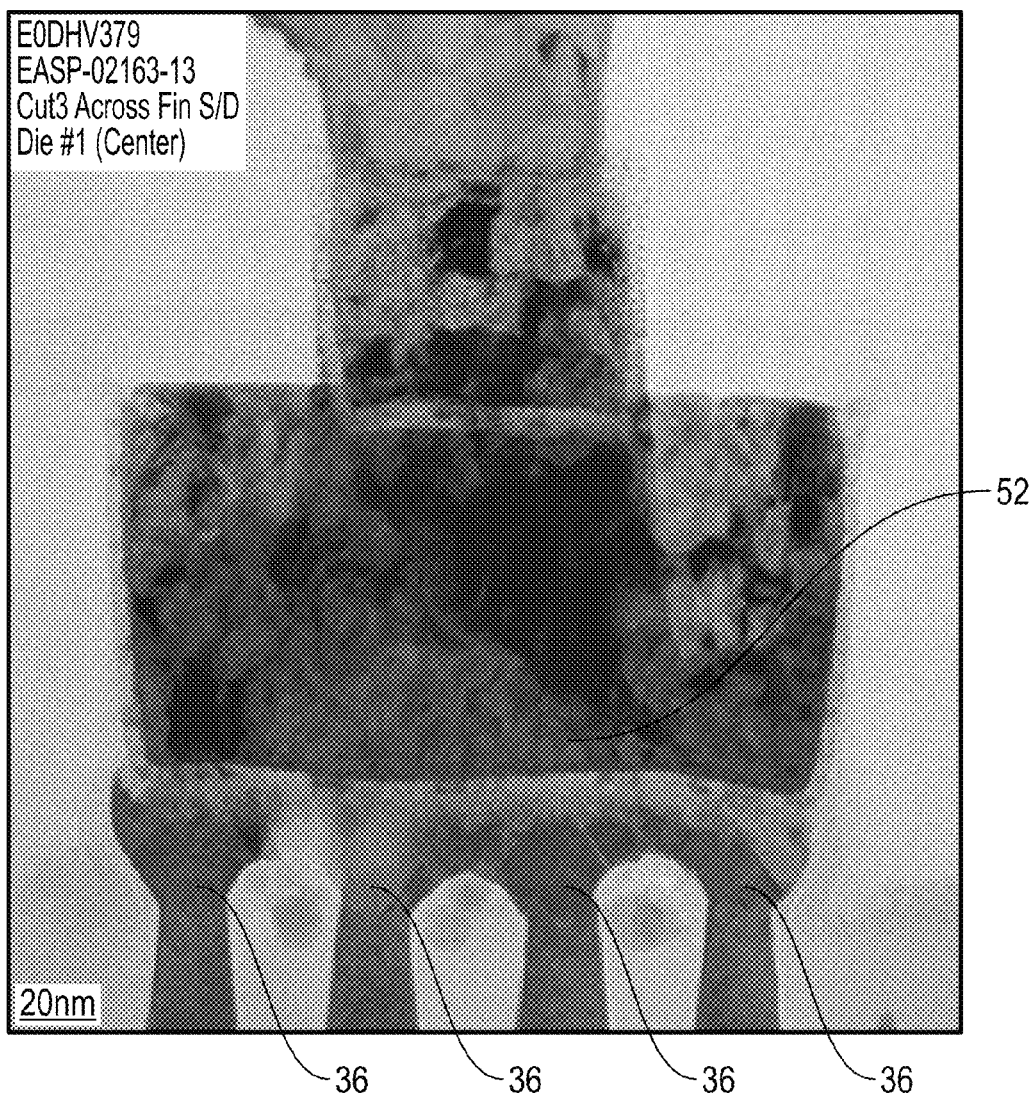
FIG. 2 is a SEM image of an integrated circuit prepared according to a prior art method with gouged diamond-shaped contact structures.

The resulting layered structure undergoes contact patterning and integrated oxide and nitride reactive ion etching (RIE) to expose the shaped contact structures. In particular, an integrated oxide and nitride RIE is effective at removing both an oxide-based PMD and a nitride-based contact etch stop layer. However, the integrated RIE employed with conventional techniques has limited selectivity with respect to the materials typically used for the contact structures. This commonly leads to unintended removal of a portion of the underlying contact structure during the etching process. Damage resulting from such over-etching is sometimes referred to in the art as gouging of the contact structures. An SEM image of gouging of the contact structures is seen in FIG. 2, where it is clear that the tops of the contact structures 36 have been removed during the contact landing preparation process, and no longer have a substantially regular cross-sectional shape. Gouging of the contact structures 36 leads to a decrease in the contact surface available during landing of electrical contact material 52, resulting in increased contact resistance.

Figure 3:
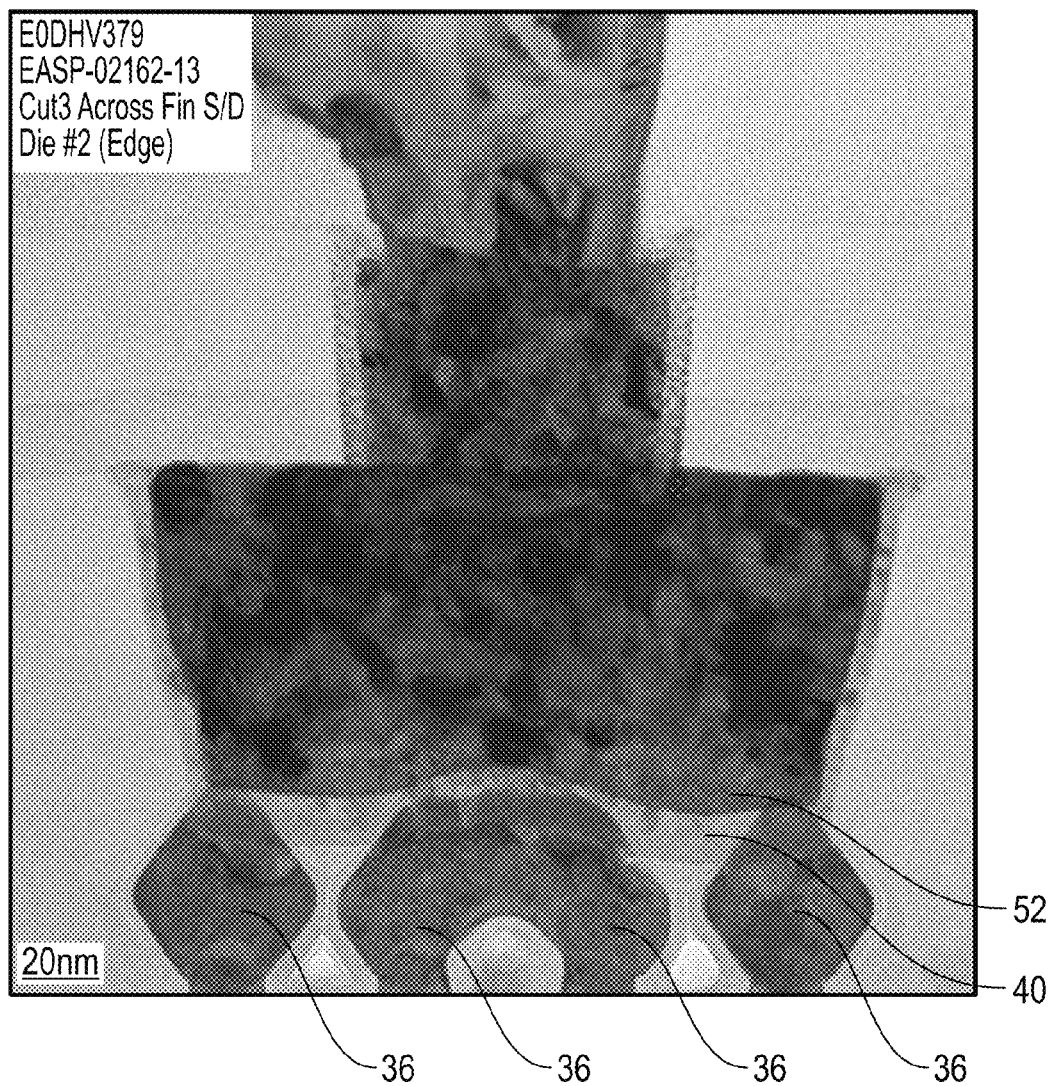
FIG. 3 is a SEM image of an integrated circuit prepared according to a prior art method with incomplete removal of a contact etch stop layer above diamond-shaped contact structures.

Alternatively, if the integrated RIE is conservatively timed so that damage to the contact structures is avoided, the contact etch stop layer is under etched. In other words, if the integrated etch is timed so as to avoid gouging of the contact structures, the integrated etch is not allowed to proceed long enough to completely remove the contact etch stop layer overlying at least a portion of the contact structures. This leaves residual contact etch stop layer material remaining and covering at least portion of the contact structures. Any such residual contact etch stop layer material obscures the underlying surface of the contact structures during landing of electrical contact material 52, resulting in increased contact resistance. An SEM image showing failure to expose at least a portion of the shaped contact structures is seen in FIG. 3 where it is clearly seen that, while the substantially regular diamond cross-sectional shape of the shaped contact structures 36 have been preserved, residual material from incomplete removal of the contact etch stop layer 40 remains and obscures at least a portion of the shaped contact structures from making contact with the contact material 52. Thus, typical contact structure preparation techniques are highly susceptible to over-etching (resulting in gouging as seen in FIG. 2) and/or under-etching (leaving behind contact etch stop layer material as seen in FIG. 3), both of which increase contact resistance at the contact structures after contact landing. As noted above, the susceptibility to over and/or under etching results from the use of an integrated RIE during contact preparation. The methods provided herein avoid the susceptibility to over and under etching inherent in conventional techniques, removing contact etch stop layer material while retaining contact structure shape integrity and decreasing contact resistance after contact landing by utilize a plurality of oxide or nitride selective etches to expose the contact structures. In this way, premetal dielectric (PMD) oxide material overlying the contact structures is removed first with one or more etch processes, and the contact etch stop layer is removed with a subsequent, highly selective, etch process.

Figure 4:
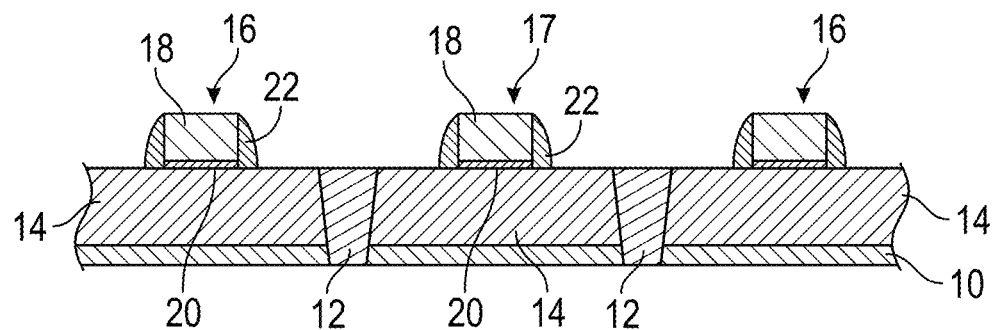
FIGS. 4-6 illustrate a portion of an integrated circuit and process for preparing the integrated circuit in accordance with an exemplary embodiment along a cross-sectional view of gates of MOS transistors of the integrated circuit.

An exemplary method of forming an integrated circuit will now be described with reference to FIGS. 4-11, which show an illustrated integrated circuit 10 at various stages, and in particular with reference to FIGS. 7-11 which show various stages of contact preparation and landing. FIGS. 7-11 show a cross-sectional view of the device during the manufacturing process such that the cross-sectional shape of the contact structures is apparent. Referring to FIG. 4, a semiconductor substrate 10 including a first semiconductor material is provided. The first semiconductor material may be any semiconductor material that is known for industrial use in electronic devices. Examples of the first semiconductor material include, but are not limited to, those chosen from silicon, silicon germanium (SiGe), germanium (Ge), gallium arsenide (GaAs), or indium phosphide (InP). For example, in an embodiment, the first semiconductor material is silicon, and the silicon is present in an amount of from about 95 to about 100 mol %, such as from about 99 to about 100 mol %, based upon the total amount of atoms in the semiconductor substrate 10. The silicon may be substantially pure, i.e., dopants and/or impurities are present in amounts of less than or equal to 1 mol % based upon the total amount of atoms in the semiconductor substrate 10 and are desirably absent from the semiconductor substrate 10.

In an embodiment and as shown in FIG. 4, shallow trench isolation (STI) structures 12 are formed in the semiconductor substrate 10, and wells 14 are formed in the semiconductor substrate 10 through conventional fabrication techniques. The wells 14 have a dopant concentration, or a concentration of conductivity determining ions, and the conductivity determining ions may be a P-type or N-type conductivity determining ions, depending upon whether a PMOS transistor or NMOS transistor is to be formed. Each well 14 contains opposite conductivity determining ions from the source region and drain region that are to be formed therein. For example, when the source region and drain region for a device include P-type conductivity determining ions, the well 14 includes N-type conductivity determining ions, and vice versa. Typical N-type conductivity determining ions include, but are not limited to, phosphorus, arsenic, antimony, and combinations thereof. Typical P-type conductivity determining ions include, but are not limited to, boron, aluminum, gallium, indium, and combinations thereof.

Figure 5:
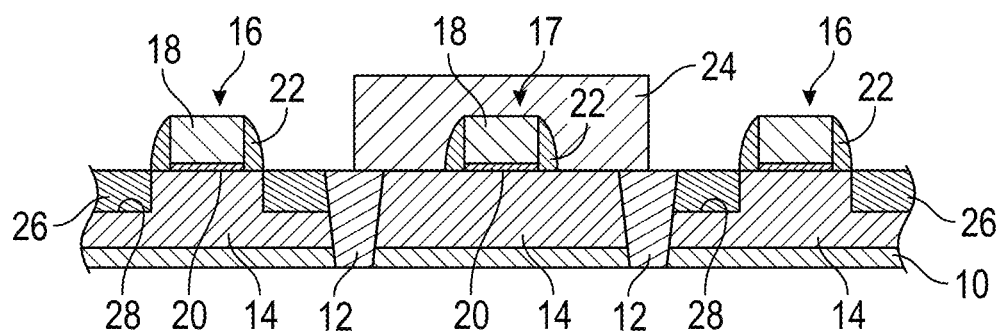
Figure 6:
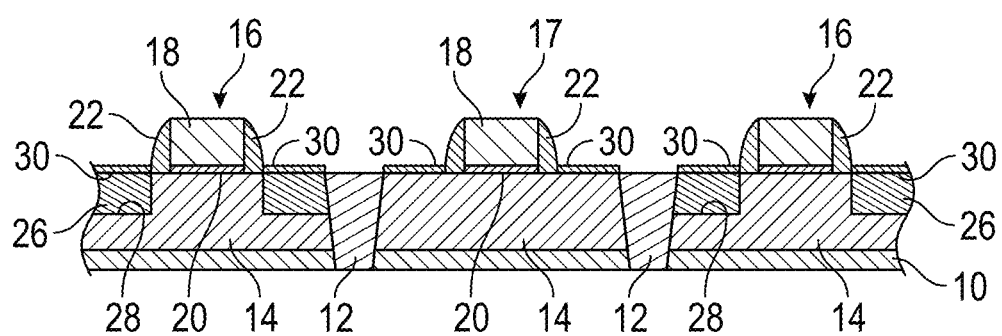

In an embodiment and as also shown in FIG. 4, a gate electrode structure 16 is formed overlying the semiconductor substrate 10. In a particular embodiment and as shown in FIG. 1, a plurality of gate electrode structures 16, 17 are formed overlying the semiconductor substrate 10. For illustrative purposes, FIGS. 4-6 show two gate electrode structures 16 for P-type devices, and one gate electrode structure 17 for an N-type device. As shown in FIG. 4, the gate electrode structures 16, 17 include a gate electrode 18 that overlies a gate dielectric layer 20. The gate electrode structures 16, 17 may be part of a metal-oxide-semiconductor (MOS) transistor device that is formed on the semiconductor substrate 10. Although the term 'MOS transistor device' properly refers to a device having a metal gate electrode and an oxide gate insulator, that term is used herein to refer to any semiconductor device that includes a conductive gate electrode (whether metal or other conductive material) that is positioned overlying a gate insulator (whether oxide or other insulator) which, in turn, is positioned overlying the semiconductor substrate 10. The gate electrode structures 16, 17 may be formed through conventional techniques. The gate dielectric layer 20 may include an insulator material such as, but not limited to silicon oxide (for example, silicon dioxide), silicon nitride, or the like. The gate electrode 18 may be formed from conventional materials including copper, silver, and doped or undoped polycrystalline silicon. Gate sidewall spacers 22 are then formed on opposite sides of the gate electrode structure 16 to insulate the gate electrode 18 and to align ion implantation into the semiconductor substrate 10.

In an embodiment and as shown in FIG. 5, a portion of the gate electrode structures 17 are selectively masked with an epitaxy mask 24 to produce masked gate electrode structures 17 and unmasked gate electrode structures 16. In the embodiment shown, the masked gate electrode structures 17 are N-type structures, and the unmasked gate electrode structures 16 are P-type structures. The epitaxy mask 24 may be formed from any masking material, such as silicon dioxide, and shields the masked N-type gate electrode structures 17 to enable formation of epitaxially-grown semiconductor regions 26 adjacent to the unmasked P-type gate electrode structures 16. In particular, in an embodiment and as also shown in FIG. 5, trenches 28 are etched adjacent to the unmasked p-type gate electrode structures 16. Etching of the trenches 28 is conducted so as to form a series of thin walled structures (or fins 32) (not seen from the viewing angle in FIG. 5) extending in an upward direction from the semiconductor substrate 10.

The semiconductor fins 32 are electrically isolated by deposition of a non-conductive material 34 (e.g., silicon oxide) (not seen from the viewing angle of FIG. 5). Deposition of the non-conductive material 34 is performed such that at least a surface at the top of each fin 32 is not covered by the non-conductive material 34, and typically performed such that a portion of each fin 32 extends above the non-conductive material 34. Shaped contact structures 36 are then deposited on an upper surface of each fin 32. The shaped contact structures 36 are typically made of a semiconductor material, such as the same semiconductor material making up the semiconductor substrate. Further, deposition of the shaped contact structures 36 typically occurs via epitaxial growth, resulting in deposition of regularly shaped contact structures due to crystal growth of the semiconductor material. Specifically, contact structures grown from epitaxial deposition of a semiconductor material typically have a cross-sectional shape approximating a diamond, and are referred herein as diamond-shaped contact structures.

Referring to FIG. 6, the epitaxy mask is removed to expose the N-type gate electrode structures 17 after epitaxially growing the semiconductor material, thereby enabling for blanket formation of a contact etch stop layer 40 and a PMD oxide layer 30 across the semiconductor substrate 10, including adjacent to both the N-type gate electrode structures 17 and the P-type gate electrode structures 16 such that the contact etch stop layer 40 and PMD oxide layer 30 overlay the shaped contact structures 36, prior to ion implantation (not seen in FIG. 6). As used herein, the term "overlying" is used to encompass both "over" and "on". In this regard, the PMD oxide layer 30 may overlie the shaped contact structures 36 such that a material layer, e.g. the contact etch stop layer 40, is interposed between the PMD oxide layer 30 and the shaped contact structures 36 such that it lies on or is in physical contact with the shaped contact structures 36.

After forming the PMD oxide layer 30, ion implantation is conducted to form a source and drain regions for the various gate electrode structures 16, 17, as well as to form associated halo regions and extension regions (not shown) as desired. To conduct ion implantation, certain gate electrode structures 16, 17 are selectively masked, leaving regions of the PMD oxide layer 30 exposed where ion implantation is desired. Mask removal and substrate cleaning follows ion implantation. Numerous cycles of masking, ion implantation, mask removal, and substrate cleaning may be conducted to form the source region and the drain region for various gate electrode structures 16, 17 as desired. It is to be appreciated that techniques for forming source regions and drain regions are dynamic and that ions are not necessarily implanted in any specific configuration in the source region and the drain region.

Figure 7:
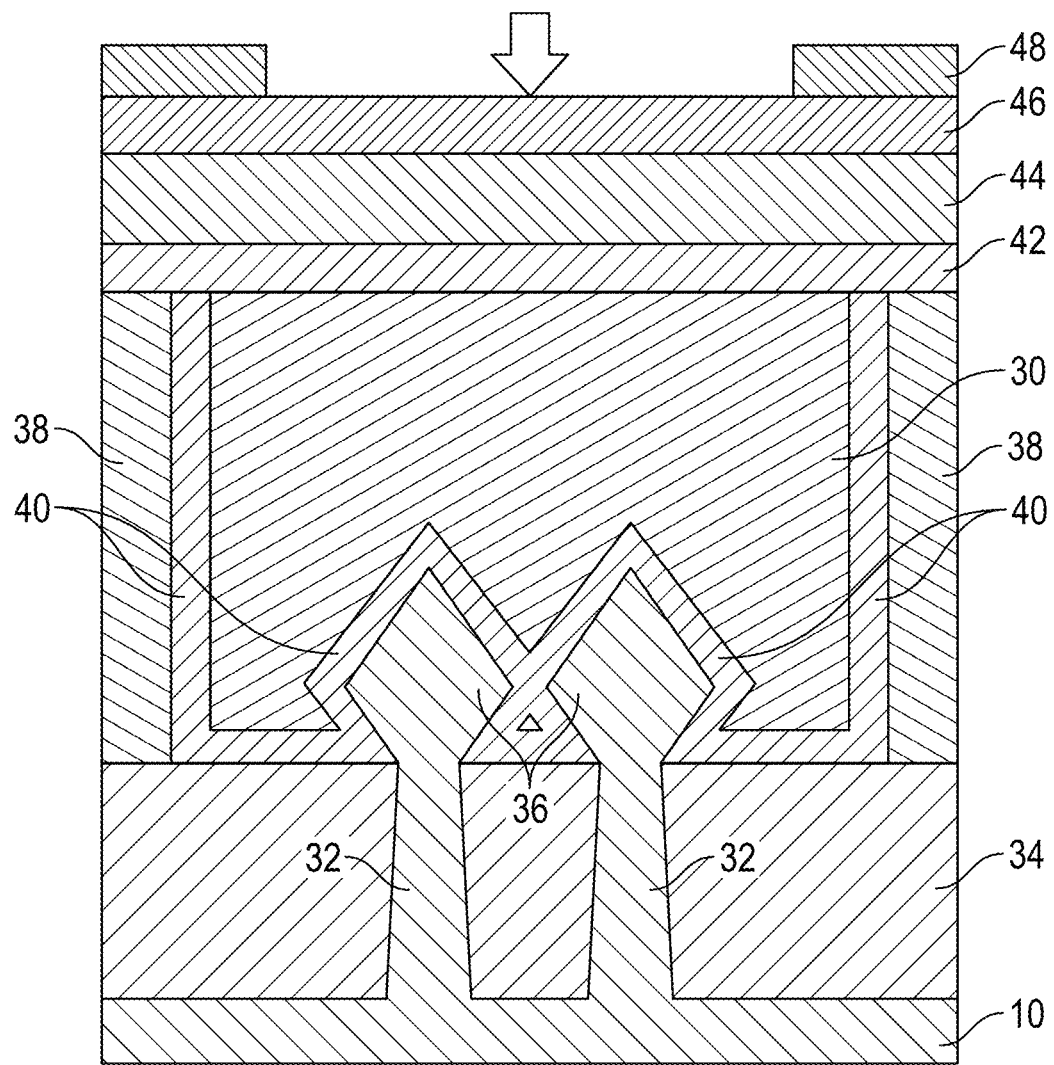
FIGS. 7-11 illustrate a portion of the integrated circuit and process for preparing the integrated circuit of FIGS. 4-6 in accordance with an exemplary embodiment along a cross-sectional view of shaped contact structures of the integrated circuit.

Referring now to FIG. 7, an integrated circuit has undergone ion implantation to form source and drain regions and is now ready for contact patterning and landing. Again, the integrated circuit includes shaped contact structures 36 located above fins 32 extending from a semiconductor substrate 10. As indicated above, the shaped contact structures 36 are located in a source or drain region adjacent to a gate electrode structure (not visible in this view). In some embodiments, a group of at least one shaped contact structure 36 is separated from another group of at least one shaped contact structure 36 by spacer sidewalls 38. Spacer sidewalls 38 are made of a semiconductor material, typically the same semiconductor material making up semiconductor substrate 10. In some embodiments, spacer sidewalls 38 were formed during fabrication of the integrated circuit by an etch process prior to formation of fins 32 and are configured such that they are substantially parallel to the fins 32, and thus substantially parallel the shaped contact structures 36.

The integrated circuit further includes a contact etch stop layer 40 overlaying the spacer sidewalls 38 (on a surface of the sidewall 38 facing the shaped contact structures 36) and the shaped contact structures 36. As illustrated in FIG. 7, the contact etch stop layer 40 overlays the spacer sidewalls 38 on a lateral surface facing the shaped contact structures 36, and overlays an upward facing surface of the shaped contact structures 36. In this exemplary embodiment, the contact etch stop layer 40 is silicon nitride and is typically about 10 nm to about 15 nm thick. The remaining volume between the spacer sidewalls 36 is occupied with the PMD oxide layer 30. In some embodiments, the PMD oxide layer 30 is undoped silicon oxide. The spacer sidewalls 38, contact etch stop layer 40, and PMD oxide layer 30 are further overlaid with a variety of layers, that may include a first tetraorthosilicate (TEOS) layer 42, an amorphous carbon layer 44, a silicon oxynitride (SiON) layer 46 and a second TEOS layer 48. The additional layers may be applied and/or etched for contact etch patterning via any suitable chemistry (including a suitable RIE).

Figure 8:
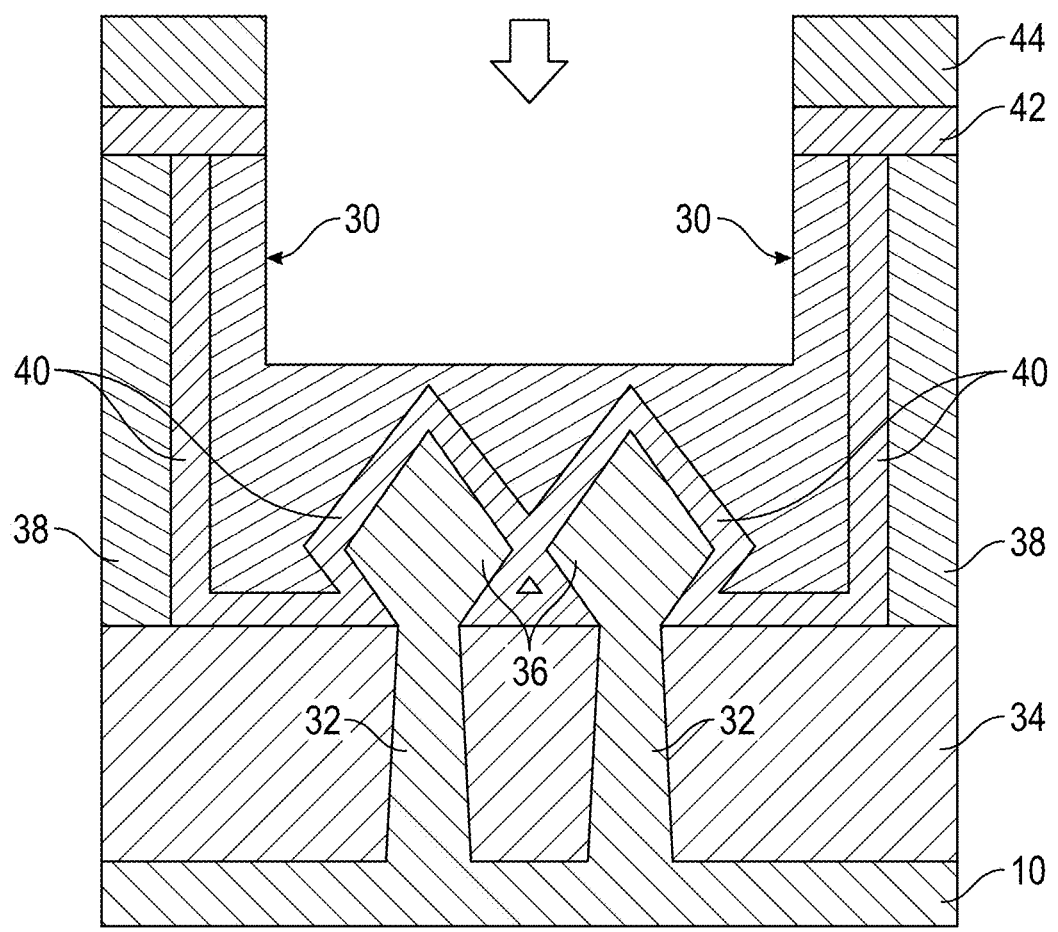

Next, as illustrated in FIG. 8, a suitable RIE is performed to expose the oxide layer 30 in a region above the shaped contact structures 36. Then, an anisotropic RIE that is oxide selective is used to remove the bulk of the PMD oxide layer material 30. The anisotropic behavior of the anisotropic RIE leaves a layer of the oxide material 30 on a lateral surface of the spacer sidewalls 38 facing the contact structures 36. In some embodiments, such as seen in FIG. 8, the oxide-selective anisotropic RIE is timed to stop before reaching the contact etch stop layer 40 overlaying the shaped contact structures 36, also leaving a layer of the oxide material 30 overlaying the contact etch stop layer 40, shaped contact structures 36 and non-conductive material 34.

Figure 9:
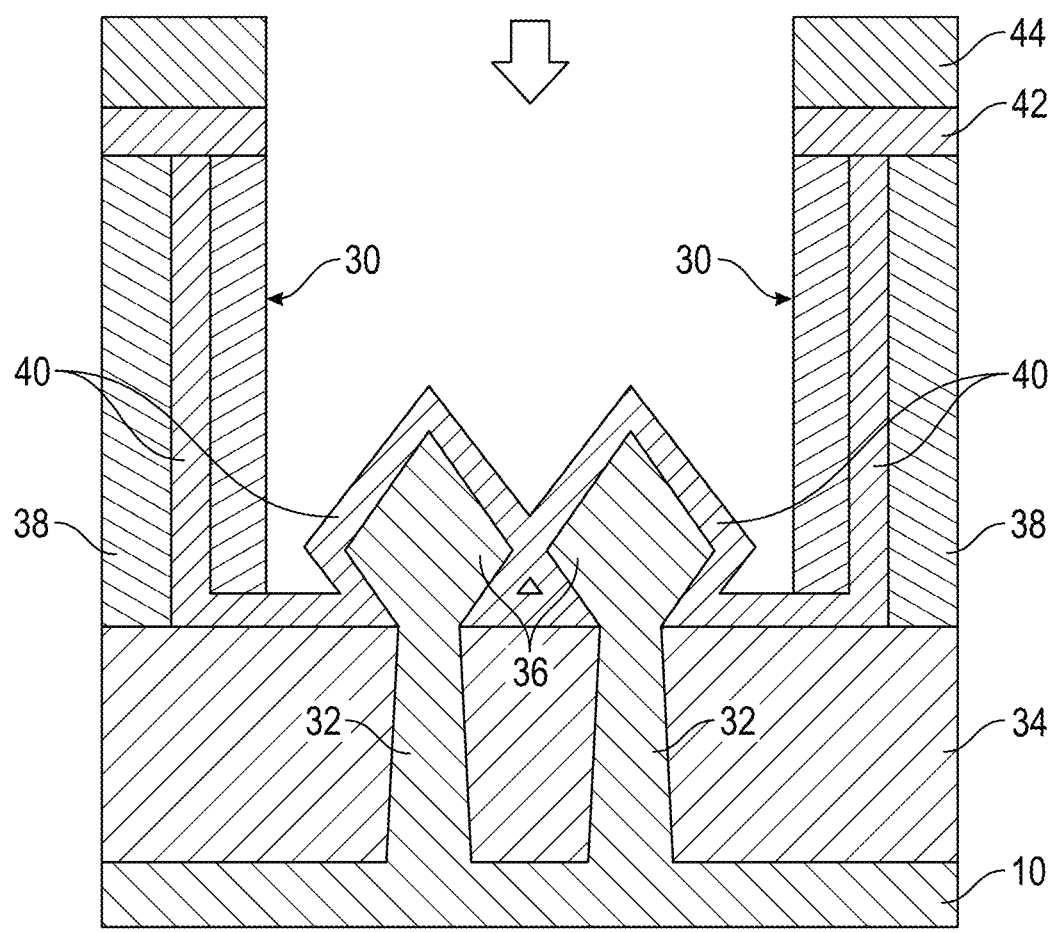

As illustrated in FIG. 9, a second anisotropic etch that is highly oxide selective is used to remove the oxide layer 30 overlying the shaped contact structures 36, thereby exposing the contact etch stop layer 40 overlaying the shaped contact structures 36. The second etch may be performed with any suitable chemistry that is selective for the removal of the oxide material. In some embodiments, the second etch is capable of removing the oxide material 30 but is substantially ineffective against the material making up the contact etch stop layer 40. As used herein, an etch is substantially ineffective against a material if contacting the etch with a surface of the material leaves the surface of the material substantially unchanged. With respect to the second etch, this means that the oxide material 30 is removed from an upper surface of the contact etch stop layer 40, leaving the surface of the contact etch stop layer 40 substantially unchanged. In some embodiments, a silicon cobalt nitride or a chemical oxide removal cleaning step, such as $NH_3/NF_3$ and $SF_6/H_2O$, is used for the second etch.

Figure 10:
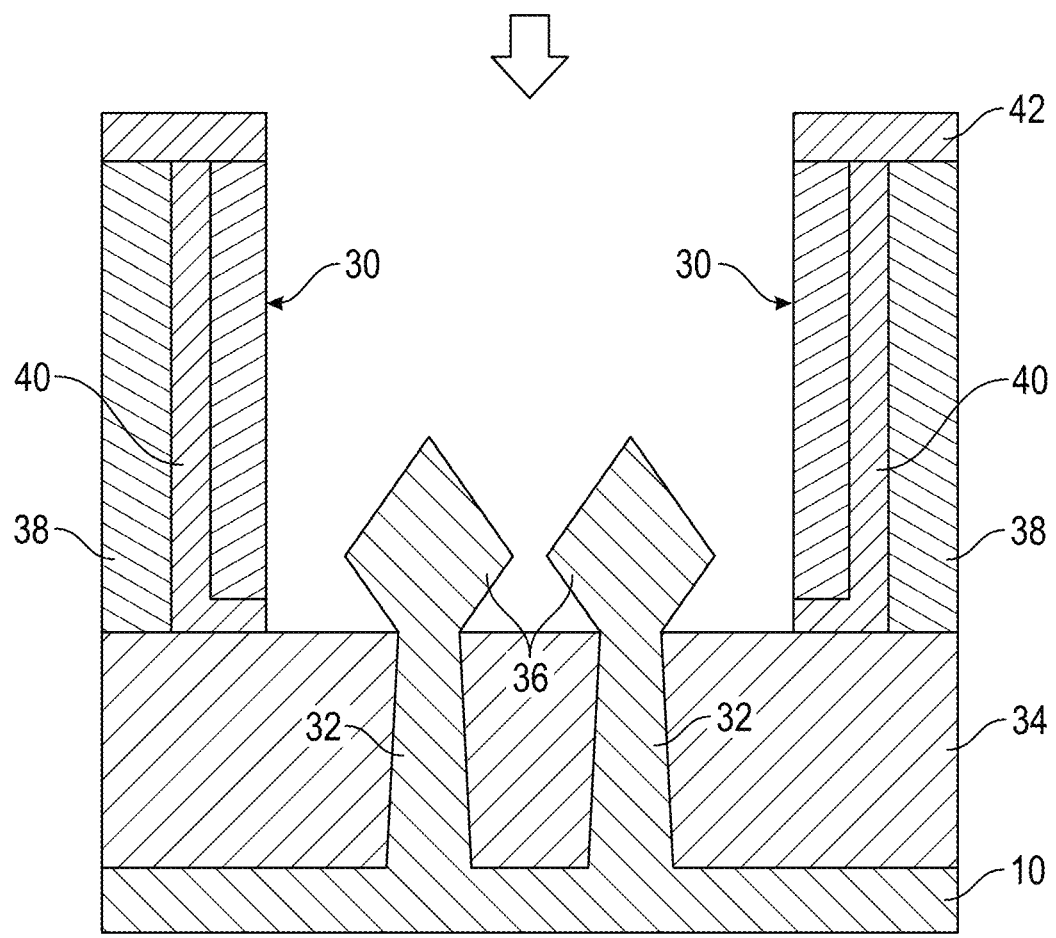

Referring to FIG. 10, once the residual oxide material 30 has been removed, a third etch such as a RIE or damage-free dry etch that is highly selective to the contact etch stop layer 40 is used to remove the contact etch stop layer 40 from the shaped contact structures 36. The third etch may be performed with any suitable chemistry that is selective for removal of the contact etch stop layer 40 material. In some embodiments, the third etch is capable of removing the contact etch stop layer 40 but is substantially ineffective against the material that forms the shaped contact structures 36. Again, this means that the contact etch stop layer 40 is removed from an upper surface of the contact structures 36, leaving the surface of the contact structures 36 substantially unchanged. In some embodiments the third etch is performed with a nitride dry etch. Use of such a selective etching technique to remove the contact etch stop layer 40 allows for exposing the shaped contact structures 36 with minimal risk of damage from an overly aggressive or otherwise unselective single etch.

Preservation of contact structure shape by use of such a selective etch results in contact structures 36 that retain a regular cross-sectional shape that is substantially equivalent to the cross-sectional shape of the shaped contact structure formed by epitaxial deposition. This means that the shaped contact structures 36 retain at least about 95%, such as about 97% or more, such as 99% or more, of the material present in the contact structures 36 prior to etching the contact etch stop layer 40. Further, this selective etch allows for removal of substantially all contact resistance stop layer 40 material from an upper surface of the contact structures 36. This means that less than about 5%, such as less than about 2%, such as less than about 1% of the contact resistance stop layer 40 remains overlaying the contact structures 36 after performance of the selective etch.

Figure 11:
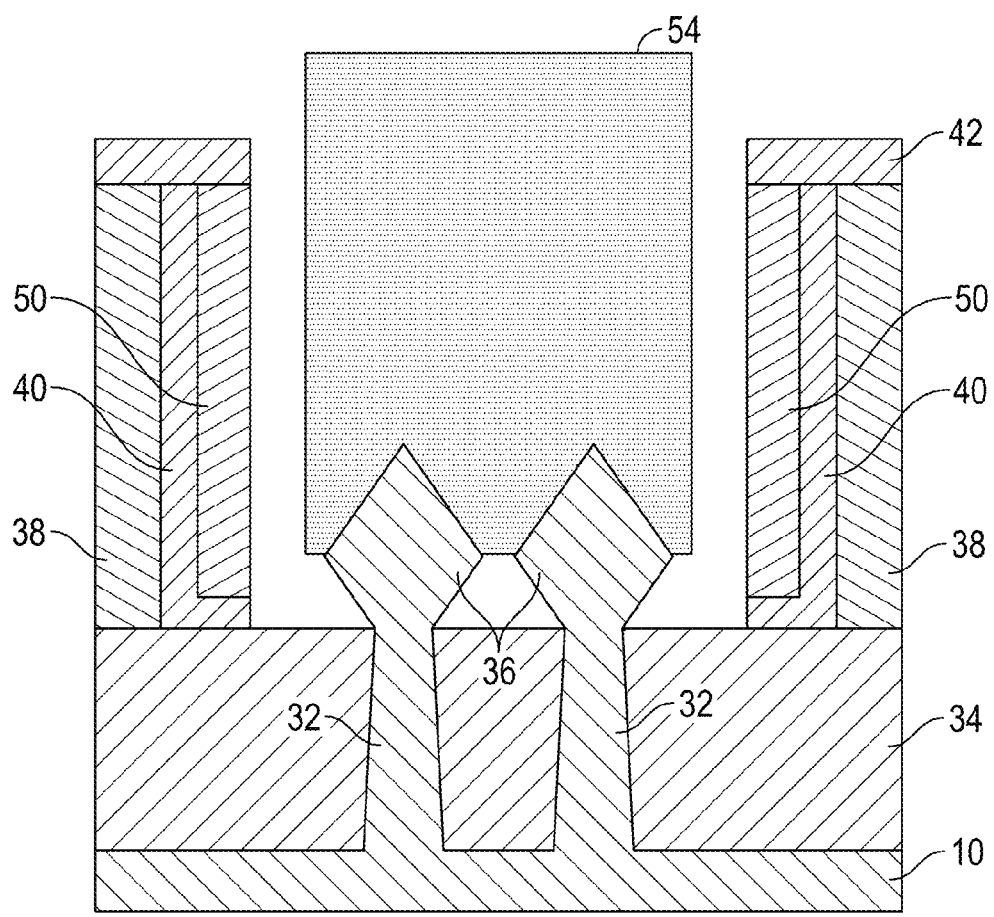

Contact landing completion is illustrated in FIG. 11, where an electrical contact material 54 is brought into contact with the shaped contact structures 36. As discussed above, improved preservation of the shaped contact structures 36 in conjunction with substantially complete removal of the contact etch stop layer 40 overlying the shaped contact structures 36 resulting from methods presented herein leads to increased contact area, and thus reduced contact resistance. In some embodiments, contact area may be increased by more than 10%, such as between 10% and 50%, relative to typical contact area in devices prepared according to prior art techniques. In some embodiments, preservation of contact structure shape by use of a highly selective third etch that is substantially ineffective against the shaped contact structures 36 results in contact resistance being less than about 5%, such as less than about 2%, such as less than about 1% different than if none of the shaped contact structure material had been removed.

Figure 12:
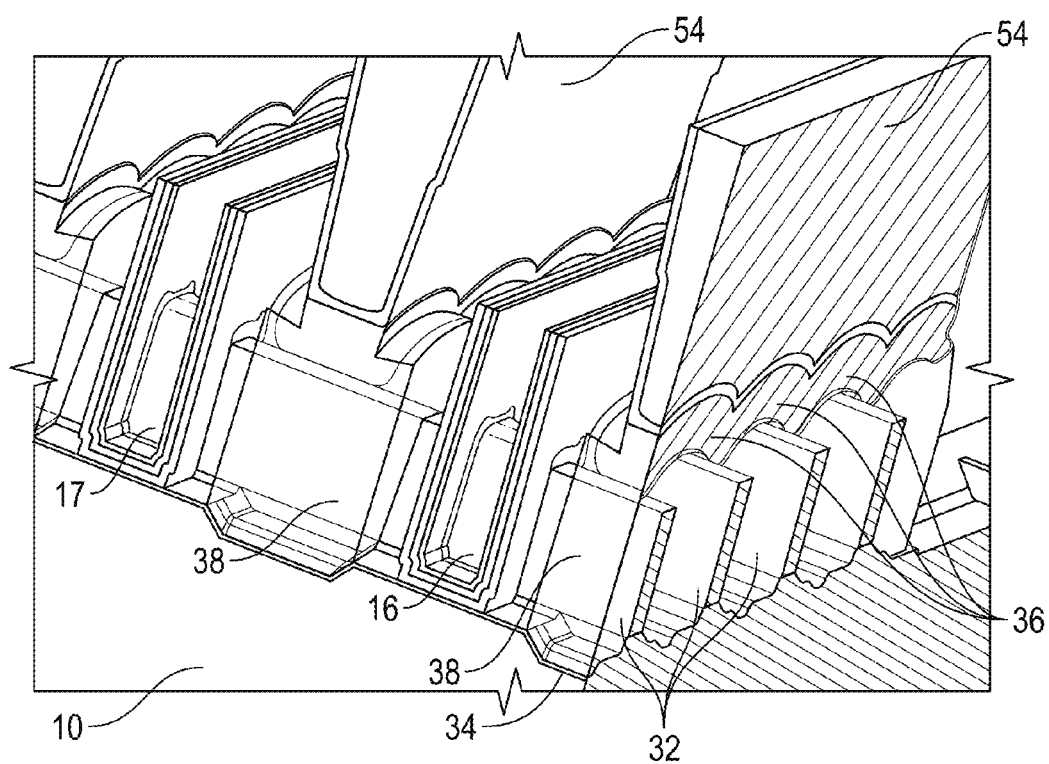
FIG. 12 is a perspective view of an integrated circuit with improved source/drain contacts in accordance with an exemplary embodiment.

An exemplary completed device prepared according to methods described herein is illustrated in FIG. 12, with electrical contact materials 52 in electrical contact with contact structures 36, which are located atop fins 32. In the exemplary embodiment shown in FIG. 12, there are four fins 32 between spacer sidewalls 38. A region in the semiconductor substrate 10 between the source and drain regions, and beneath the gate electrode structures 16 and 17, forms a channel of the transistor. Although not shown in FIG. 12, it is to be appreciated that millions of transistors may be formed on a semiconductor substrate 10. In some embodiments, at least one level of interconnect routing may be formed over the transistor on the semiconductor substrate 10, which is consistent with integrated circuit manufacture. Such a layer of interconnect routing may generally include a layer of interlayer dielectric material with embedded electrical interconnects disposed therein that can be designed to form complex electrical circuitry that is characteristic of integrated circuits.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A process for preparing an integrated circuit, the process comprising: providing a semiconductor structure comprising a transistor with a gate electrode structure, sidewall spacers disposed on opposite sides of the gate electrode structure to insulate the gate electrode structure and to align ion implantation into the semiconductor substrate, and source and drain regions, wherein at least one of the source and drain regions comprises a shaped contact structure overlaid with a contact etch stop layer and a pre-metal dielectric material, wherein the shaped contact structure has a substantially diamond-shaped cross-sectional shape; overlaying the shaped contact structure with a contact etch stop layer and a pre-metal dielectric material; removing a first portion of the pre-metal dielectric material overlaying the shaped contact structure with a first anisotropic etch such that a second portion of the pre-metal dielectric material remains overlaying the shaped contact structure; removing the second portion of the pre-metal dielectric material overlaying the shaped contact structure with a second anisotropic etch, wherein the second anisotropic etch is capable of etching the pre-metal dielectric material while being substantially ineffective against the contact etch stop layer; removing the contact etch stop layer overlaying the shaped contact structure with a third anisotropic etch to expose the shaped contact structure, wherein the third anisotropic etch is capable of etching the contact etch stop layer while being substantially ineffective against the shaped contact structure so as to preserve the substantially diamond-shaped cross-sectional shape of the shaped contact structure after exposure to the third anisotropic etch.

2. The process of claim 1, wherein the shaped contact structure comprises an epitaxially deposited semiconductor material.

3. The process of claim 1, wherein the shaped contact structure comprises an epitaxially deposited semiconductor material selected from the group consisting of silicon, silicon germanium (SiGe), germanium (Ge), gallium arsenide (GaAs), or indium phosphide (InP).

4. The process of claim 1, wherein the contact etch stop layer comprises a nitride material.

5. The process of claim 1, wherein the pre-metal dielectric material, including both the first portion and the second portion, comprises an oxide material.

6. The process of claim 1, wherein the first anisotropic etch is timed to stop before reaching the contact etch stop layer.

7. The process of claim 1, wherein the second anisotropic etch uses $NH_3/NF_3$ or $SF_6/H_2O$.

8. The process of claim 1, wherein the second anisotropic etch is a chemical oxide removal cleaning step.

9. The process of claim 1, wherein the third anisotropic etch is a nitride dry etch.

10. A process for fabricating an integrated circuit, the process comprising: providing a semiconductor substrate; forming a transistor with a gate electrode structure, sidewall spacers disposed on opposite sides of the gate electrode structure to insulate the gate electrode structure and to align ion implantation into the semiconductor substrate, and source and drain regions in and on the semiconductor substrate, wherein at least one of the source and drain regions comprises a shaped contact structure, wherein the shaped contact structure has a substantially diamond-shaped cross-sectional shape; overlaying the shaped contact structure with a contact etch stop layer and a pre-metal dielectric material; removing a first portion of the pre-metal dielectric material overlaying the shaped contact structure with a first anisotropic etch such that a second portion of the pre-metal dielectric material remains overlaying the shaped contact structure; removing the second portion of the pre-metal dielectric material overlaying the shaped contact structure with a second anisotropic etch, wherein the second anisotropic etch is capable of etching the pre-metal dielectric material while being substantially ineffective against the contact etch stop layer; removing the contact etch stop layer overlaying the shaped contact structure with a third anisotropic etch to expose the shaped contact structure, wherein the third anisotropic etch is capable of etching the contact etch stop layer while being substantially ineffective against the shaped contact structure so as to preserve the substantially diamond-shaped cross-sectional shape of the shaped contact structure after exposure to the third anisotropic etch; applying an electrical contact material to the exposed shaped contact structure.

11. The process of claim 10, wherein the shaped contact structure comprises an epitaxially deposited semiconductor material.

12. The process of claim 10, wherein the shaped contact structure comprises an epitaxially deposited semiconductor material selected from the group consisting of silicon, silicon germanium (SiGe), germanium (Ge), gallium arsenide (GaAs), or indium phosphide (InP).

13. The process of claim 10, wherein the contact etch stop layer comprises a nitride material.

14. The process of claim 10, wherein the pre-metal dielectric material comprises an oxide material.

15. The process of claim 10, wherein the first anisotropic etch is timed to stop before reaching the contact etch stop layer.

16. The process of claim 10, wherein the second anisotropic etch $NH_3/NF_3$ or $SF_6/H_2O$.

17. The process of claim 10, wherein the second anisotropic etch is a chemical oxide removal cleaning step.

18. The process of claim 10, wherein the third anisotropic etch is a nitride dry etch.

* * * * *